United States Patent
Schneider et al.

(10) Patent No.: US 7,266,027 B2
(45) Date of Patent: Sep. 4, 2007

(54) INTEGRATED SEMICONDUCT MEMORY WITH TEST CIRCUIT

(75) Inventors: Ralf Schneider, München (DE); Stephan Schröder, München (DE); Manfred Pröll, Dorfen (DE); Herbert Benzinger, München (DE)

(73) Assignee: Infineon Technologies AG, Neubiberg (DE)

( * ) Notice: Subject to any disclaimer, the term of this patent is extended or adjusted under 35 U.S.C. 154(b) by 127 days.

(21) Appl. No.: 11/235,540

(22) Filed: Sep. 27, 2005

(65) Prior Publication Data
US 2006/0120176 A1     Jun. 8, 2006

(30) Foreign Application Priority Data
Sep. 28, 2004    (DE) ................ 10 2004 047 058

(51) Int. Cl.
*G11C 7/00*    (2006.01)

(52) U.S. Cl. .................... 365/201; 365/189.11

(58) Field of Classification Search ........... 365/201
See application file for complete search history.

(56) References Cited

U.S. PATENT DOCUMENTS

2003/0223277 A1*  12/2003  Origasa ............. 365/189.11

FOREIGN PATENT DOCUMENTS

EP            1252631 B1    10/2001

* cited by examiner

*Primary Examiner*—Amir Zarabian
*Assistant Examiner*—Jason Lappas
(74) *Attorney, Agent, or Firm*—Edell, Shapiro & Finnan, LLC

(57) ABSTRACT

An integrated semiconductor memory includes word lines connected to a first voltage potential via a respective first controllable switch and a respective third controllable switch and to a second voltage potential via a respective second controllable switch. In order to test whether one of the word lines is connected to the first voltage potential via its respective first and third controllable switches, the one of the word lines is connected to a comparator circuit via the respective second controllable switch and a driver line. After the respective first and third controllable switches have been controlled into the on state, in a test operating state of the integrated semiconductor memory, the respective second controllable switch is controlled into the on state and a potential state on the word line is evaluated by the comparator circuit. The result of the evaluation is fed to an external data terminal by an evaluation signal.

19 Claims, 5 Drawing Sheets

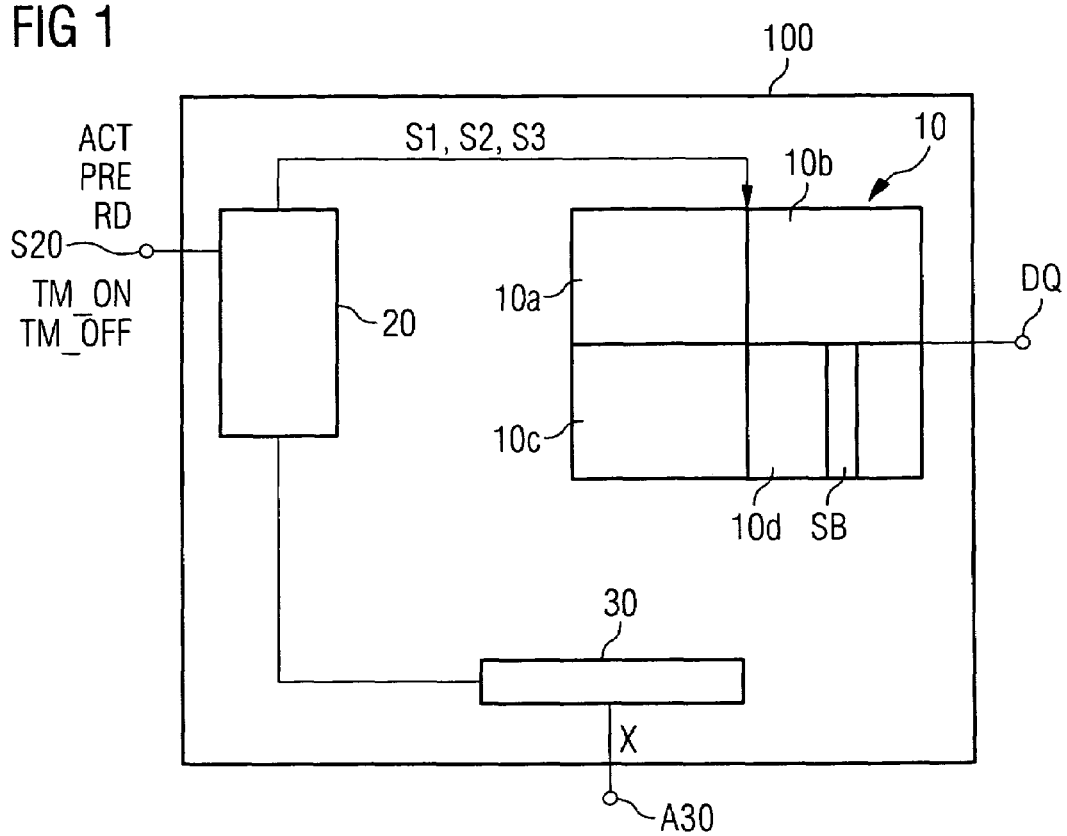
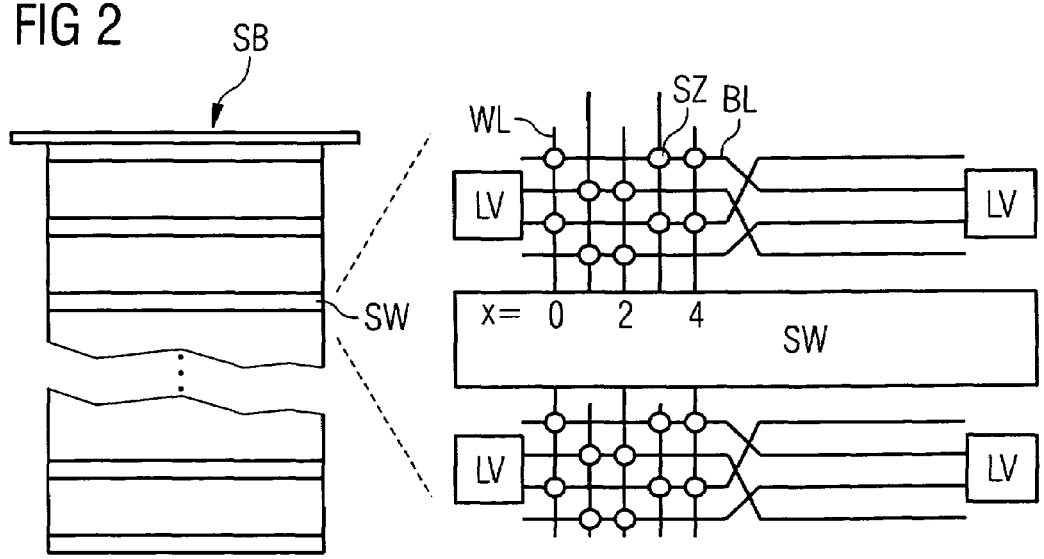

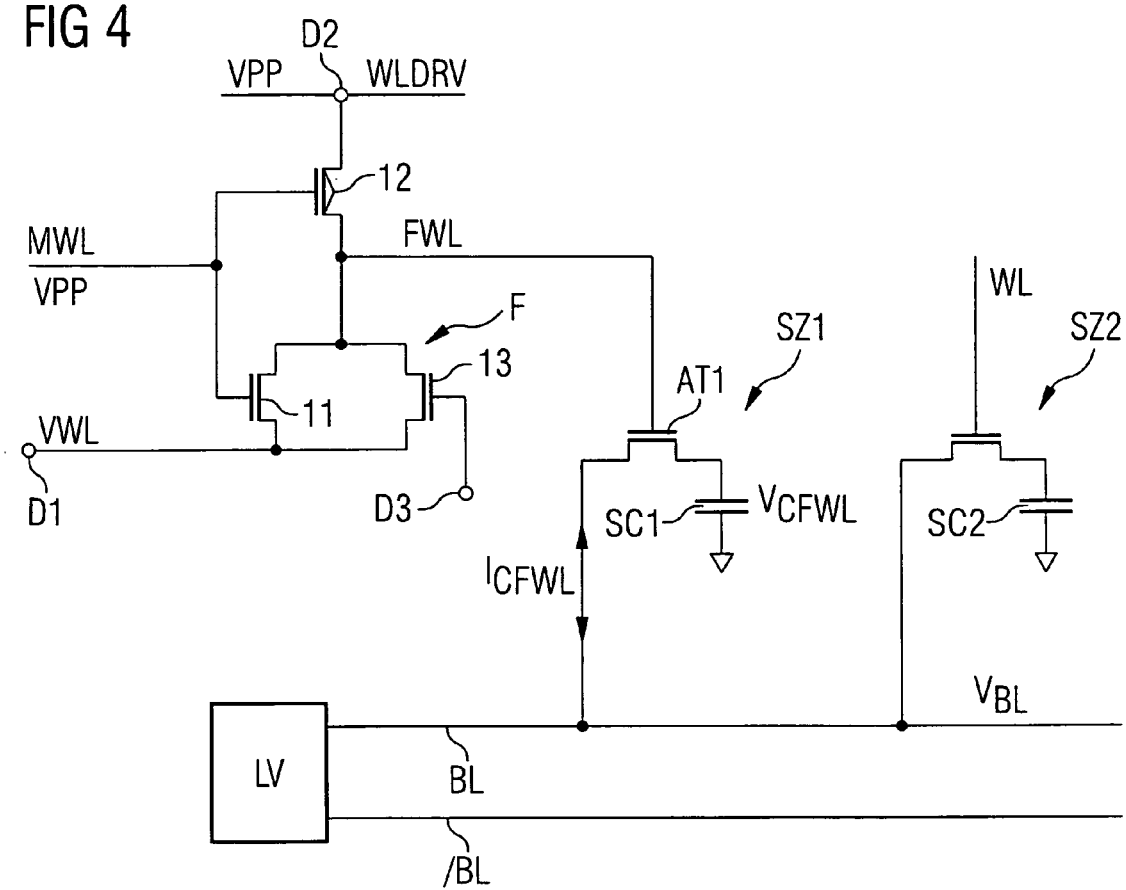
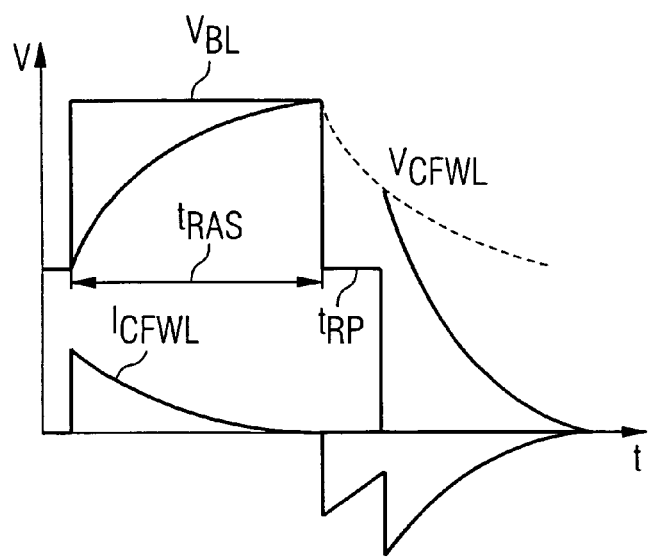

INTEGRATED SEMICONDUCT MEMORY WITH TEST CIRCUIT

CROSS-REFERENCE TO RELATED APPLICATION

This application claims priority under 35 USC §119 to German Application No. DE 102004047058.8, filed on Sep. 28, 2004 and titled "Integrated Semiconductor Memory with Test Circuit," the entire contents of which are hereby incorporated by reference.

FIELD OF THE INVENTION

The invention relates to an integrated semiconductor memory with a test circuit for testing the integrated semiconductor memory.

BACKGROUND

FIG. 1 shows an integrated semiconductor memory 100, for example, a DRAM (dynamic random access memory) semiconductor memory, which includes a memory cell array 10, a control circuit 20 with a control terminal S20, and an address register 30 with an address terminal A30. The memory cell array 10 is subdivided into different memory banks 10a, 10b, 10c, 10d. Each memory bank has a plurality of memory blocks SB. Within the memory blocks, memory cells are arranged along word and bit lines. A data terminal DQ serves for reading data into and out of the memory cells.

For controlling the mode of operation of the integrated semiconductor memory, the integrated semiconductor memory includes a control circuit 20 with a control terminal S20. Depending on the control signal applied externally to the control terminal S20, write and read operations are monitored and controlled by the control circuit 20. For this purpose, the control circuit 20 generates internal control signals S1, S2, S3 to drive further components of the integrated semiconductor memory, for example, the memory cell array or voltage generators.

FIG. 2 shows, in enlarged fashion, the memory block SB within the memory bank 10d as illustrated in FIG. 1. The memory block SB includes a plurality of segmented word line drivers arranged in strips SW within the memory block SB. On both sides of each segmented word line driver strip SW, the memory cells SZ are arranged at crossover points of word lines WL and bit lines BL. For accessing one of the memory cells SZ arranged along the word line with the word line address X=0, the word line WL is activated by the associated segmented word line driver.

For faster activation of a word line, recent memory generations do not have a central word line driver, but rather additional intermediate amplifiers that drive a large word line capacitance of the word line connected to them. The use of the intermediate amplifiers within the segmented word line driver strip SW results in a faster propagation time for a word line signal and thus a faster access time overall.

FIG. 3 shows an enlarged illustration of the segmented word line driver strip SW from FIG. 2 with a first intermediate amplifier comprising the switching transistors 11, 12, 13, and a second intermediate amplifier comprising the switching transistors 11', 12', 13'. The first intermediate amplifier activates the word line WL, whereas the second intermediate amplifier activates word line WL'. Memory cells SZ1, SZ2 are connected to the word lines WL, WL'.

In the case of a DRAM semiconductor memory, a memory cell SZ, as illustrated, for example, for the memory cell SZ1, includes a selection transistor AT and a storage capacitor SC. The selection transistor AT is controlled into the on state by a control signal on the word line WL and, in this state, connects the storage capacitor to the connected bit line for reading an item of information into and out of the memory cell. By a corresponding word line signal on the word lines WL and WL', the memory cell SZ1 and the memory cell SZ2 are conductively connected to the bit line BL1 and the bit line BL2, respectively.

The two intermediate amplifiers of FIG. 3 are identical in terms of their construction, for which reason the construction is described here only with reference to the first intermediate amplifier. Via the n-channel transistor 11, the word line WL is connected to a terminal D1 for applying a voltage potential VWL. Via the p-channel transistor 12, the word line is connected to a terminal D2 for applying a voltage potential VPP and for applying a ground potential GND. Via the n-channel transistor S13, which is controlled by control voltage potentials VWL and Vint at its control terminal S13, the word line WL is connected to the terminal D1 for applying the voltage potential VWL. The switching transistors 11, 12 are controlled into the on state or the off state by a control signal on a master word line MWL. For activating the word line WL, the control circuit 20 generates the low voltage potential VWL on the master word line MWL. As a result, the p-channel transistor 12 is switched into the on state and the n-channel transistor 11 is turned off.

If a voltage generator 40 is driven by a state of the control signal S1 such that the voltage generator 40 generates a high voltage potential VPP on the output side and feeds the high voltage potential VPP onto the driver line WD. Then, the word line WL is connected to the high voltage potential VPP by the transistor 12 controlled into the on state. As a result, the selection transistor AT of the memory cell SZ1 is controlled into the on state, so that the storage capacitor SC is connected to the bit line BL1. Depending on the charge state of the storage capacitor SC, this results in a potential increase or a potential decrease on the bit line BL1, which is amplified by a sense amplifier LV (illustrated in FIG. 2) connected to the bit line.

However, the feeding in of the voltage potential VWL on the master word line MWL simultaneously causes the p-channel transistor 12' of the second intermediate amplifier to be controlled into the on state. In order that only the memory cell SZ1 is accessed, a voltage generator 40' connected to the driver line WD' is driven by the control circuit such that the voltage generator 40' feeds a ground potential GND onto the driver line. In order to ensure that the selection transistor associated with the memory cell SZ2 is turned off, a further n-channel transistor 13' is connected in parallel with the n-channel transistor 11'. The further n-channel transistor is additionally controlled into the on state as a result of its control terminal S13' being driven by the control circuit 20 with a high control voltage potential Vint. A terminal D1 for applying the low voltage potential VWL is thereby conductively connected to the word line WL'. The word line WL' is thus charged to the low voltage potential VWL, which reliably turns off the selection transistor of the memory cell SZ2.

If neither of the two memory cells SZ1, SZ2 is accessed, then the master word line MWL is driven by the high voltage potential VPP. As a result, the transistors 11 of the first intermediate amplifier and 11' of the second intermediate amplifier are controlled into the on state, so that the word line WL and the word line WL' are connected to the low voltage potential VWL. Consequently, the selection transistors of the memory cells SZ1, SZ2 are turned off.

In an area-optimized layout, there is a risk of the two n-channel transistors 11 and 13 not being connected to the word line WL after the fabrication process. A word line having such a defect cannot turn off in controlled fashion the selection transistors that it controls, since a controlled applying the voltage potential VWL onto the word line is not possible. Even though such word lines are identified as defective and repaired, the word lines are still physically situated in the cell array. The word line signal of a repaired word line in the case of which the n-channel transistors of its connected intermediate amplifier are missing may be charged to a high voltage potential via the p-channel transistor, for example, and thus partly activate the selection transistors connected to the defective word line.

In this respect, FIG. 4 shows, for example, a defective word line FWL with its connected intermediate amplifier, in the case of which the two n-channel transistors 11 and 13 are not connected to the word line FWL. The defective word line FWL is replaced by a redundant word line in this case. In order that the selection transistors connected to the defective word line FWL remain permanently turned off, the master word line MWL is driven by the high voltage potential VPP. However, the subthreshold behavior of the p-channel transistor 12 may have the effect that its controllable path is not permanently turned off. The transistor 12 thus behaves like a resistor via which the defective word line FWL is gradually charged to almost the high voltage potential VPP. As a result, for example, the selection transistor AT1 (illustrated in FIG. 4) of the memory cell SZ1 connected to the defective word line FWL attains the on state. The memory cell SZ1 has a leakage current behavior as a result. By the selection transistor AT1 controlled into the on state and behaves like a resistor and by the storage capacitor SC1, the memory cell acts like a low-pass filter connected to the bit line BL.

FIG. 5 shows the potential profile on the bit line BL and the voltage $V_{CFWL}$ established due to the leakage current $I_{CFWL}$ on the storage capacitor SC1 of the memory cell SZ1. When a datum, for example, a high state, is written to the memory cell SZ2, the sense amplifier LV feeds a high voltage potential onto the bit line BL. By the selection transistor AT1 that is partly controlled into the on state, the storage capacitor SC1 of the memory cell SZ1 is slowly charged during the writing time tRAS to the voltage potential $V_{BL}$ of the bit line by a positive leakage current $I_{CFWL}$. In the precharge phase, during the time $t_{RP}$, the bit line BL and its complementary bit line /BL are charged to a common precharge potential. During this time, the storage capacitor SC1 is discharged again onto the bit line BL via the selection transistor AT1 controlled into the on state. A negative leakage current $I_{CFWL}$ flows in this case. In the case of short precharge times $t_{RP}$, the storage capacitor SC1 is not completely discharged. If a high level is subsequently written again to a memory cell connected to the bit line BL, then the storage capacitor SC1 is charged further by the voltage potential fed onto the bit line BL by the sense amplifier LV. In the worst-case scenario, the voltage potential on the storage capacitor SC1 builds up to an ever higher voltage potential.

If a memory cell, for example, the memory cell SZ2, is then accessed in reading fashion, the storage capacitor SC1, as a result of the leakage current $I_{CFWL}$ flowing out of the memory cell SZ1, feeds a charge onto the bit line BL which shifts a small voltage swing, originating from the read-out of the charge state of the storage capacitor of the memory cell SZ2, in an opposite direction. As a consequence, the sense amplifier LV amplifies this signal swing that is directed oppositely to the signal swing of the original storage state of the memory cell SZ2.

On account of component-specific leakage currents, defective word lines that can no longer be connected to the low voltage potential VWL via a transistor of their intermediate amplifier have very different time constants with which the voltages on the defective word line change. Moreover, the defective word lines are influenced by capacitive coupling in the event of access to memory cells in the immediate vicinity. This means that it is often no longer possible to test this fault pattern deterministically within tenable times.

An integrated semiconductor memory with a test circuit used to ascertain whether a word line can no longer be connected to a predetermined voltage potential, for example, a voltage potential for turning off selection transistors, and a method to test whether a word line can no longer be driven by a predetermined voltage potential, for example, a voltage potential for turning off selection transistors, are desirable.

SUMMARY

An integrated semiconductor memory with a test circuit according to the present invention includes an external terminal, a word line, a terminal for applying a first voltage potential, a terminal for applying a second voltage potential, a first controllable switch, a second controllable switch, a comparator circuit with a first input terminal for applying an input signal, a second input terminal for applying a reference signal, and an output terminal for generating an evaluation signal. A level of the reference signal lies between the first and second voltage potentials. The word line is connected via the first controllable switch to the terminal for applying a first voltage potential. The word line is connected via the second controllable switch to a terminal for applying a second voltage potential. The terminal for applying the second voltage potential is connected to the first input terminal of the comparator circuit. Furthermore, the terminal for applying the second voltage potential is isolated from the second voltage potential. The evaluation signal generated by the comparator circuit on the output side is fed to the external terminal of the integrated semiconductor memory.

If the terminal for applying the second voltage potential is connected to the second voltage potential, then the word line is charged to the second voltage potential in the case of a second controllable switch being controlled into the on state. If the second controllable switch is subsequently turned off and the first controllable switch is controlled into the on state, the word line is charged to the first voltage potential. The terminal for applying the second voltage potential is then isolated from the second voltage potential, so that the terminal is at a floating potential state together with the first input terminal of the comparator circuit. If, in this state, the second controllable switch is controlled into the on state, the first input terminal of the comparator circuit is driven by the potential on the word line. The potential level of the word line is compared with a level of the reference signal by the comparator circuit. It is thereby possible to detect whether the potential level of the word line lies above or below the level of the reference signal. If the first or second controllable switch is defective, the first input terminal of the comparator circuit remains at the second voltage potential lying above the level of the reference signal. If, by contrast, the word line is connected via the first controllable switch to the first voltage potential and via the second controllable switch to the second voltage potential, a potential state lying below the level of the reference signal is established at the first input terminal of the comparator circuit.

In one exemplary implementation, the integrated semiconductor memory includes a third controllable switch. The word line is connected via the third controllable switch to the first voltage potential.

If the third controllable switch is permanently controlled into the on state during evaluation of the potential level on the word line, then the word line is permanently connected to the first voltage potential during evaluation of its potential level. As a result, the signal, which acts on the first input terminal of the comparator circuit in the event of reading back via the second controllable switch, is driven actively.

In a further embodiment of the integrated semiconductor memory, the integrated semiconductor memory has a controllable switch and a voltage generator for generating the second voltage potential. The voltage generator is connected via the fourth controllable switch to the terminal for applying the second voltage potential.

Furthermore, the integrated semiconductor memory according to the invention has a fifth controllable switch. In this embodiment, the output terminal of the comparator circuit is connected via the fifth controllable switch to the external terminal of the integrated semiconductor memory.

According to a further embodiment of the integrated semiconductor memory, the terminal for applying the second voltage potential is, for example, a terminal for applying a ground potential. The terminal for applying the second voltage potential and for applying the ground potential is isolated from the ground potential. For example, the ground potential is applied via the fourth controllable switch to the terminal for applying the second voltage potential and for applying the ground potential.

In this embodiment, after applying the second voltage potential for charging the word line to the second voltage potential, the terminal for applying the second voltage potential and the ground potential is connected to the ground potential via the fourth controllable switch. The fourth controllable switch is then turned off, so that the terminal for applying the second voltage potential and the ground potential is at the floating potential state. If the first and third controllable switches are defective, but the second and third controllable switches are controlled into the on state and into the off state, a potential above the level of the reference signal is established at the first input terminal of the comparator circuit. If, by contrast, the word line is connected to the first voltage potential via the first and third controllable switches, but the second controllable switch is defective, the first input terminal remains at the ground potential, i.e., below the level of the reference signal. In this embodiment, it is thereby possible to distinguish between a fault of the first and third controllable switches and a fault of the second controllable switch.

According to another exemplary embodiment, the integrated semiconductor memory has a further first controllable switch, a further second controllable switch, and a further comparator circuit with a first input terminal for applying an input signal, a second input terminal for applying a reference signal, an output terminal for generating a further evaluation signal, and a logic gate. The further word line is connected via a further first controllable switch to the terminal for applying the first voltage potential. Moreover, the further word line is connected via the further second controllable switch to a further terminal for applying the second voltage potential and the ground potential. Furthermore, the further terminal for applying the second voltage potential and the ground potential is isolated from the second voltage potential and the ground potential. The further word line can additionally be connected via the further second controllable switch to the first input terminal of the further comparator circuit. The evaluation signal generated by the comparator circuit and the further evaluation signal generated by the further comparator circuit is fed to the logic gate on the input side. The logic gate is connected to the external terminal of the integrated semiconductor memory on the output side.

This makes it possible for only an evaluation signal to output at the external terminal of the integrated semiconductor memory. The evaluation signal specifies whether at least one of the word lines could not be charged to the first voltage potential.

A method for testing an integrated semiconductor memory provides for using an integrated semiconductor memory including an external terminal, a comparator circuit, and a word line, which can be connected optionally via a first controllable switch to a first voltage potential or via a second controllable switch to a second voltage potential. In the case of a read and write access to a memory cell connected to the word line, the word line is connected to the second voltage potential and otherwise to the first voltage potential. For selecting the word line, an address signal is applied to the integrated semiconductor memory. Afterward, an activation signal is applied to the integrated semiconductor memory for turning off the first controllable switch and for controlling the second controllable switch into the on state. Subsequently, a precharge signal is applied to the integrated semiconductor memory for controlling the first controllable switch into the on state and for turning off the second controllable switch. A test mode signal is then applied for switching the integrated semiconductor memory into a test operating state. The first controllable switch is turned off in the test operating state of the integrated semiconductor memory. For evaluating a potential level on the selected word line, in the test operating state, the activation signal is subsequently applied to the integrated semiconductor memory. The potential level on the selected word line is finally evaluated by the comparator circuit by comparing the potential level on the selected word line with a reference level. An evaluation signal is subsequently generated by the comparator circuit with a first state level, if the potential level on the selected word line lies below the reference level. The evaluation signal is generated by the comparator circuit with a second state level, if the potential level on the selected word line lies above the reference level. The first and second state levels of the evaluation signal are then fed to the external terminal.

In one a further exemplary implementation of the method for testing the integrated semiconductor memory, in the integrated semiconductor memory, the word line is connected to the first voltage potential via a third controllable switch. The third controllable switch is controlled into the on state in the test operating state of the integrated semiconductor memory by applying the test mode signal to the integrated semiconductor memory.

In another exemplary implementation of the method for testing the integrated semiconductor memory, in the integrated semiconductor memory, the word line is connected via the second controllable switch to an input terminal of the comparator circuit. By applying the test mode signal to the integrated semiconductor memory, a ground potential is applied to the input terminal of the comparator circuit. The input terminal of the comparator circuit is subsequently isolated from the ground potential, so that the input terminal of the comparator circuit is at a floating potential state. The potential level on the selected word line is evaluated by the second controllable switch of the selected word line is controlled into the on state due to the activation signal applied in the test operating state of the integrated semiconductor memory, and the selected word line thereby being connected to the input terminal of the comparator circuit.

BRIEF DESCRIPTION OF THE DRAWINGS

The invention is explained in more detail below with reference to the figures showing exemplary embodiments of the present invention. In the figures:

FIG. 1 illustrates an integrated semiconductor memory according to the invention, FIG. 2 illustrates an enlarged detail from a memory block of a memory cell array according to the invention, FIG. 4 illustrates a defective intermediate amplifier with a detail from a connected memory cell array, FIG. 5 illustrates a current/voltage diagram of a bit line connected to a defective memory cell.

DETAILED DESCRIPTION

Figure 3:
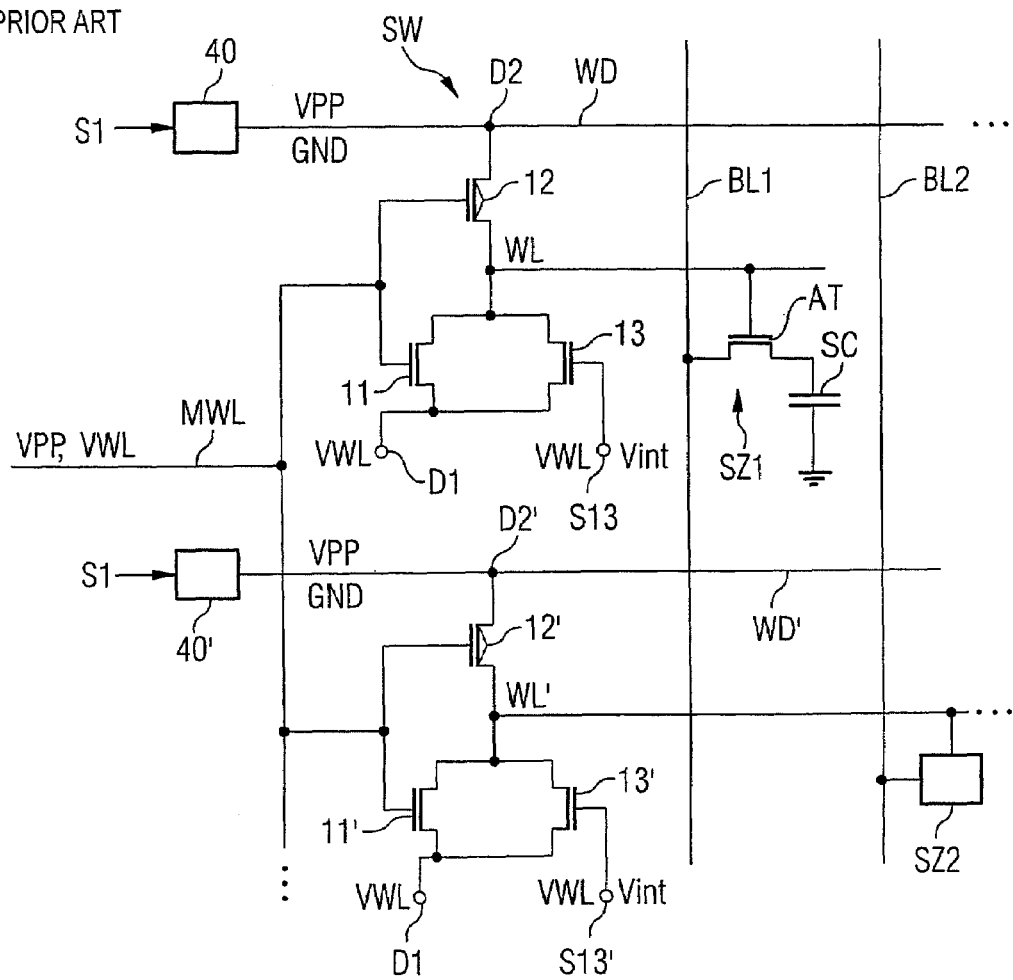
FIG. 3 illustrates an enlarged detail from a segmented word line driver strip in accordance with the prior art.
Figure 6:
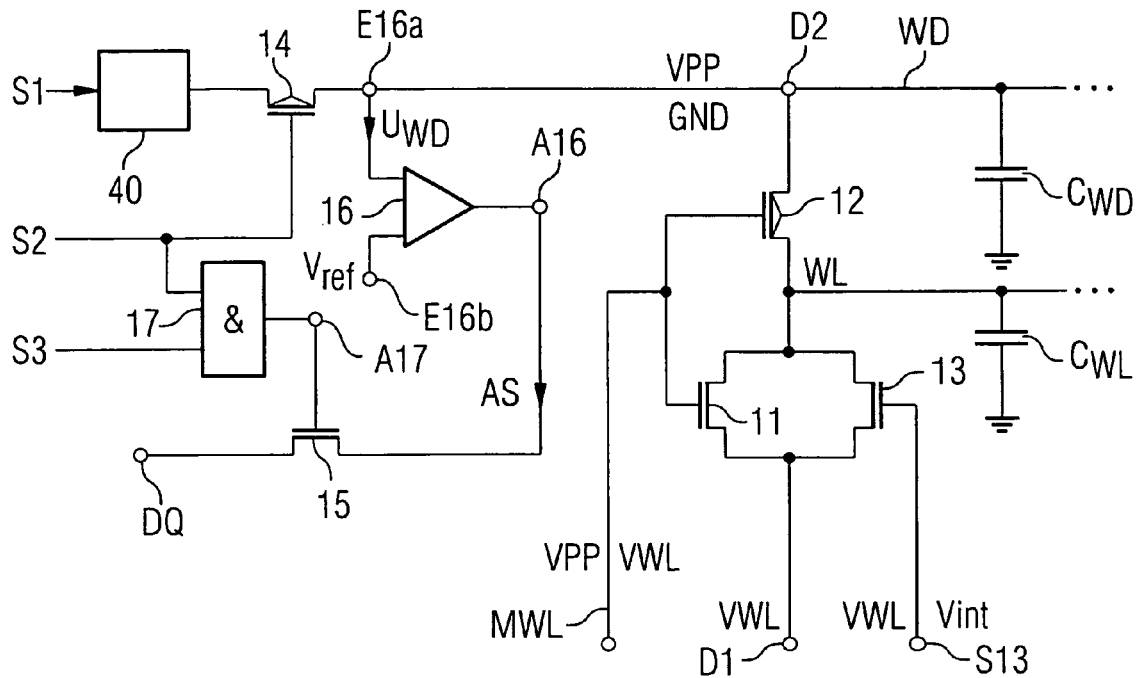
FIG. 6 illustrates a test circuit for detecting a defective intermediate amplifier according to the invention.

FIG. 6 shows a test circuit according to the invention for testing whether the word line WL is connected via the transistors 11, 13 to the terminal D1 for applying the voltage potential VWL. The circuit includes the intermediate amplifier (already explained in FIG. 3) with transistors 11, 12, 13, via which the word line WL is driven optionally with the low voltage potential VWL or the high voltage potential VPP. A comparator circuit 16 with an input terminal E16a is connected to the driver line WD. A further input terminal E16b of the comparator circuit 16 is driven by a reference signal Vref. An output terminal A16 of the comparator circuit 16 is connected via a controllable switch 15 to the data terminal DQ of the integrated semiconductor memory. The driver line WD is connected to the voltage generator 40 via a p-channel transistor 14. The control terminal of the transistor 14 is driven by the control circuit 20 by a control signal S2. A control terminal of the transistor 15 is connected to an output terminal A17 of an AND gate 17. The AND gate 17 is driven, on the input side, by the control signal S2 and a control signal S3 generated by the control circuit 20.

The functioning of the test circuit according to the invention is explained in more detail below with reference to FIG. 7. At the beginning of the test method, an address signal X is applied to the address terminal A30 of the address register 30. One of the word lines, for example, the word line WL from FIG. 6, is selected for the test method by the address signal X. An activation signal ACT is subsequently applied to the control terminal S20. The activation signal ACT has the effect, in conjunction with the address signal X applied to the address register 30, that the master word line MWL is driven with the low voltage potential VWL. The p-channel transistor 12 is thereby switched into the on state. Due to the activation signal ACT, the voltage generator 40 is driven by the control circuit with a state of the control signal S1 such that the voltage generator 40 generates the high voltage potential VPP on the output side. The controllable switch 14 is switched into the on state by a state of the control signal S2 of the control circuit 20, so that the high voltage potential VPP is present at the terminal D2 and, consequently, via the transistor 12 controlled into the on state, the high voltage potential VPP is likewise present at the word line WL. If the p-channel transistor 12 is defective, by contrast, the word line voltage remains undefined.

The control circuit 20 is subsequently driven by a precharge signal PRE. The control circuit 20 thereupon drives the voltage generator 40 with a state of the control signal S1 such that the voltage generator 40 switches the ground potential GND to its output. For this purpose, the voltage generator 40 is connected, for example, to a ground potential (not illustrated in FIG. 6) switched onto the driver line WD on the output side via the transistor 14. The driver line WD is thus charged to the ground potential GND via the transistor 14 that is still controlled in the on state. The master word line MWL is charged to the high voltage potential VPP due to the precharge command PRE. As a result, the p-channel transistor 12 is turned off and the n-channel transistor 11 is controlled into the on state. In the case of a functional transistor 11 connected to the word line WL, the word line WL is charged to the low potential VWL, for example, a negative voltage potential below the ground potential GND. If, by contrast, the n-channel transistor 11 is defective or is not connected to the word line WL, the word line WL approximately retains the high voltage potential VPP to which it was charged on account of the activation signal ACT.

The control circuit 20 is subsequently driven with a test mode signal TM_ON for switching on a test operating state. In the activated test mode, the control circuit 20 isolates the driver line WD from the voltage generator 40 by driving the control terminal of the transistor 14 with a high potential level of the control signal S2. The driver line WD is thus at a floating potential state.

Afterward, the activation signal ACT in conjunction with the address signal X is once again applied to the integrated semiconductor memory. The control circuit 20 thereupon drives the master word line MWL with the low voltage potential VWL. The transistor 12 is switched into the on state and the transistor 11 is turned off. If the word line WL was charged to the negative voltage potential VWL due to the precharge signal PRE, i.e., the n-channel transistor 11 operated directly during the precharge phase, then approximately the ground potential GND is established on the driver line WD as a result of the threshold voltage drop at the transistor 12. If, by contrast, the p-channel transistor 12 is not functioning, the driver line WD likewise remains at the ground potential level GND. If, by contrast, the transistor 12 is functioning correctly, but the n-channel transistor 11 has a fault, then the word line is also charged to the high voltage potential VPP by the activation signal ACT. This charge is then forwarded to the driver line WD via the transistor 12 controlled into the on state. Consequently, charge equalization takes place between the word line WL and the driver line WD that is at the floating potential state. The charge equalization is dependent on the ratio of the capacitances $C_{WL}$ of the word line WL and the capacitance $C_{WD}$ of the driver line WD. On account of this capacitive voltage divider, a signal $U_{WD}$ having approximately the value $U_{WD} \approx C_{WL}*VPP/(C_{WL}+C_{WD})$ develops on the driver line WD. In order that the comparator circuit 16 can reliably detect this potential increase on the driver line WD, the level of the reference voltage Vref is expediently chosen as $Vref=U_{WD}/2$.

The driver line WD remains at virtually the value of the ground potential GND, if the word line WL is connected to the negative voltage potential VWL via the transistor 11. In this case, the comparator circuit 16 generates an evaluation signal AS with a low state level, for example, at its output terminal A16. If, by contrast, the word line WL cannot be charged to the low voltage potential VWL, since either transistor 11 is defective or not connected to the word line WL, the word line WL remains at the high voltage potential VPP. The voltage $U_{WD}$ is established on the driver line WD. In this case, the comparator circuit 16 generates the evaluation signal AS with a height state level, for example, on the output side.

For reading out the test result, the integrated semiconductor memory is driven by a read command RD in the test operating state. The control circuit 20 thereupon generates the control signal S3 with a high level. The control signal S2, by which the p-channel transistor remains permanently turned off during the test operating state, likewise has the high level. Consequently, the AND gate 17 generates a high level on the output side which high level controls the n-channel transistor 15 into the on state. The evaluation signal AS is thus forwarded to the external data terminal DQ.

An improvement to the test method is achieved, if the n-channel transistor 13 is permanently controlled into the on state when the integrated semiconductor memory is switched into the test operating state. The high voltage potential Vint is applied to its control terminal S13 by the control circuit 20. If the n-channel transistor 13 is functioning and the parallel circuit comprising the two n-channel transistors 111 and 13 is connected correctly to the word line WL, the word line WL is thus permanently at the low voltage potential VWL in the test operating state. As a result, the signal which acts on the driver line WD in the event of reading back via the p-channel transistor 12 is driven actively.

An alternative assessment concept precharges the driver line WD to the high voltage potential VPP upon applying the precharge command PRE by the voltage generator 40 before the potential level of the word line WL is read out via the p-channel transistor 12. This means that no signal change is produced on the driver line WD in the case of missing or defective n-channel transistors 11, 13 and in the case of a p-channel transistor 12 that cannot be controlled into the on state. It is not possible in this case, therefore, to distinguish whether the n-channel transistors 11, 13 or the p-channel transistor 12 is defective. Since a functioning n-channel transistor 11, 13, respectively, pull the word line WL to the low voltage potential VWL and the driver line WD to the ground potential GND, however, a significantly increased signal/noise ratio is to be expected in this case.

Figure 7:
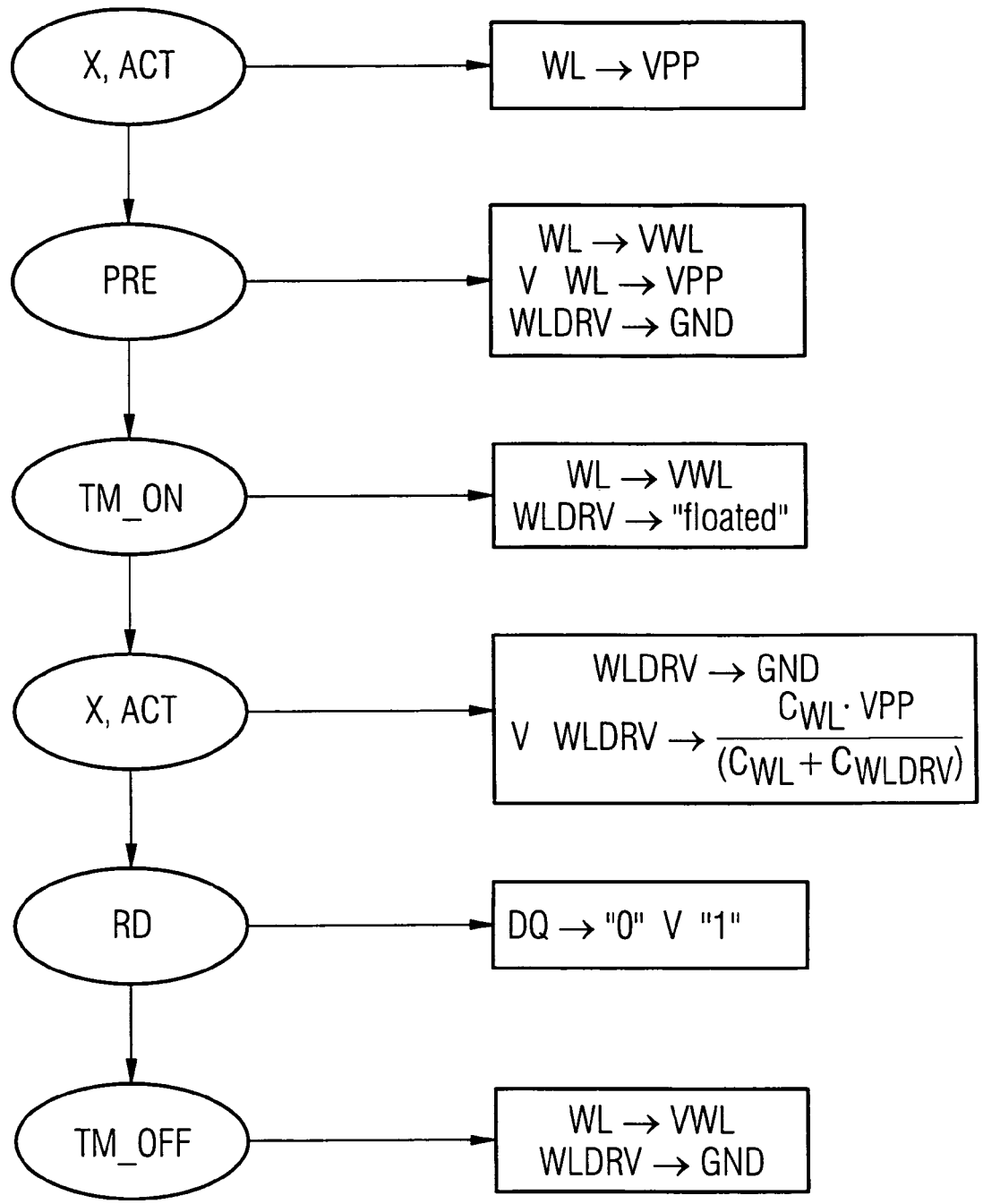
FIG. 7 illustrates a test method for detecting a defective intermediate amplifier according to the invention.

There is, on the one hand, the possibility of individually testing each word line by applying its specific word line address X to the address register 30 and by repeating all the test steps described in FIG. 7. In this method, the test result of the respective word line must be read out by driving the control circuit 20 with the read command RD within each test loop.

Figure 8:
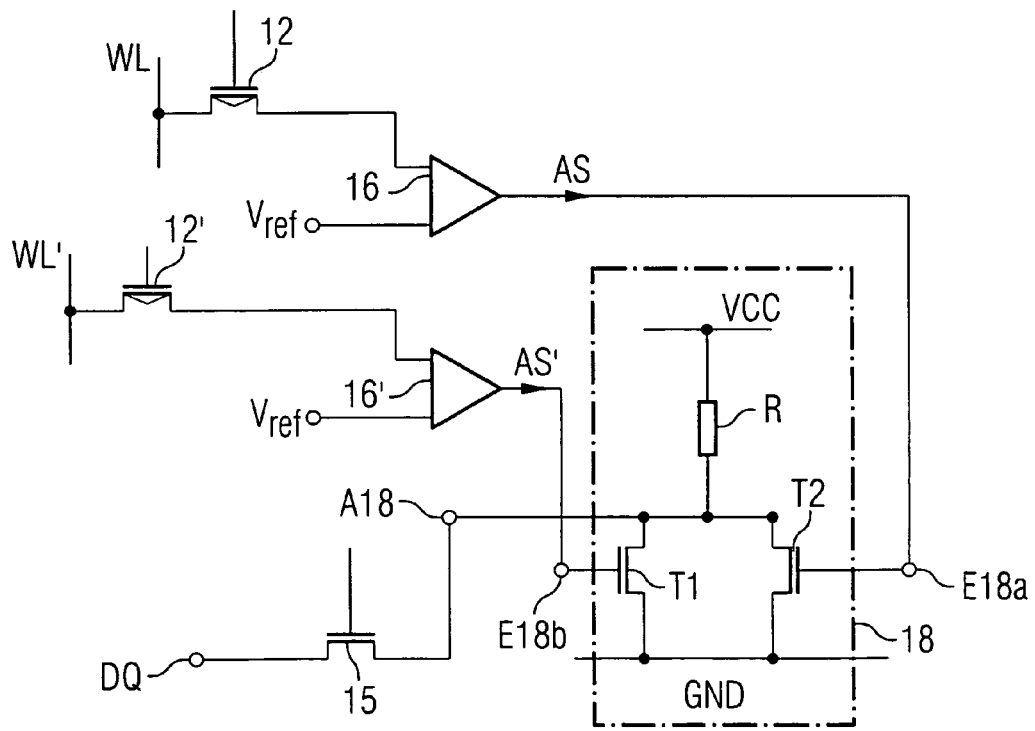
FIG. 8 illustrates a test circuit for parallel testing of a plurality of intermediate amplifiers according to the invention.

FIG. 8 shows a further embodiment of the integrated semiconductor memory according to the invention, in which the outputs of a plurality of comparator circuits 16 and 16', which are connected via respective p-channel transistors 12, 12' to different word lines WL, WL', are fed to an OR gate 18 via the input terminals E18a, E18b. The OR gate 18 includes a resistor R connected to a positive voltage potential VCC and, via transistors T1, T2 connected in parallel and the control terminals of which are in each case connected to the input terminals E18a, E18b, to the ground potential GND.

If one of the comparator circuits generates a high state level on the output side since a defective n-channel transistor has been detected in the intermediate amplifier that drives the word line WL or the word line WL', the transistor T1 or T2 driven by the respective evaluation signal AS or AS' is controlled into the on state, so that the level of the ground potential GND occurs at an output terminal A18 of the OR gate 18.

In order to ascertain whether one of the intermediate amplifiers connected to the word lines has a defective n-channel transistor part, the test result after testing of the word lines needs to be output at the data terminal DQ a single time by the read command RD, which controls the transistor 15 into the on state. However, even without this parallelism, the test method is extremely short and reliably detects the problematic fault signature without overtesting.

While the invention has been described in detail and with reference to specific embodiments thereof, it will be apparent to one skilled in the art that various changes and modifications is made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

LIST OF REFERENCE SYMBOLS

10 Memory cell array/memory bank
11, 12, 13 Controllable switches
14, 15 Controllable switches
16 Comparator circuit
17, 18 Gates
20 Control circuit
30 Address register
40 Voltage generator
100 Integrated semiconductor memory
ACT Activation signal
AS Evaluation signal
AT Selection transistor
BL Bit line
$C_{WD}$ Parasitic capacitance of the driver line
$C_{WL}$ Parasitic capacitance of the word line
DQ Data terminal
FWL Defective word line
GND Ground potential
$I_{CFWL}$ Leakage current
LV Sense amplifier
MWL Master word line
PRE Precharge signal
R Resistor
RD Read signal
S Control signal
SB Memory block
SC Storage capacitor
SW Segmented word line driver strip
SZ Memory cell
T Transistor
TM Test mode signal
$t_{RAS}$ Activation time of a word line
$t_{RP}$ Precharge time
$U_{WD}$ Level on the driver line
$V_{BL}$ Potential of the bit line VCC Positive voltage potential
$V_{CFWL}$ Potential state of the storage capacitor
Vint Internal voltage potential
VPP Positive voltage potential
VWL Negative voltage potential
WD Driver line
WL Word line

What is claimed:

1. An integrated semiconductor memory with test circuit, comprising: an external terminal;
a word line;
a terminal for applying a first voltage potential;
a terminal for applying a second voltage potential;
a first controllable switch;
a comparator circuit with a first input terminal for applying an input signal and a second input terminal for applying a reference signal and an output terminal for generating an evaluation signal, wherein a level of the reference signal lies between the first and second voltage potentials, and the evaluation signal generated by the comparator circuit on the output side is fed to the external terminal of the integrated semiconductor memory; and
a second controllable switch, wherein the word line is connected via the first controllable switch to the terminal for applying the first voltage potential, the word line is connected via the second controllable switch to the terminal for applying a second voltage potential, the terminal for applying the second voltage potential is connected to the first input terminal of the comparator circuit, and the terminal for applying the second voltage potential is isolated from the second voltage potential.

2. The integrated semiconductor memory as claimed in claim 1, further comprising:
a third controllable switch,
wherein the word line is connected via the third controllable switch to the first voltage potential.

3. The integrated semiconductor memory as claimed in claim 2, further comprising:
a fourth controllable switch; and
a voltage generator for generating the second voltage potential,
wherein the voltage generator is connected via the fourth controllable switch to the terminal for applying the second voltage potential.

4. The integrated semiconductor memory as claimed in claim 3, further comprising:
a fifth controllable switch,
wherein the output terminal of the comparator circuit is connected via the fifth controllable switch to the external terminal of the integrated semiconductor memory.

5. The integrated semiconductor memory as claimed in claim 3, wherein
the terminal for applying the second voltage potential is a terminal for applying a ground potential, and
the terminal for applying the second voltage potential and the ground potential is isolated from the ground potential.

6. The integrated semiconductor memory as claimed in claim 5, wherein the ground potential is applied via the fourth controllable switch to the terminal for applying the second voltage potential and the ground potential.

7. The integrated semiconductor memory as claimed in claim 1, further comprising:
a memory cell array including memory cells connected to the word line, the memory cell array being connected to a respective bit line via a respective selection transistor,
wherein one of the memory cells is electrically isolated from the respective bit line, if the word line connected to the memory cell is connected to the first voltage potential via the first controllable switch controlled into the on state, and
wherein the one of the memory cells is connected to the respective bit line, if the word line connected to the memory cell is connected to the second voltage potential via the second controllable switch controlled into the on state.

8. The integrated semiconductor memory as claimed in claim 3, further comprising:
a control circuit for controlling the integrated semiconductor memory with a control terminal,
wherein, in the case where the control terminal is driven with a first control signal, the control circuit switches the integrated semiconductor memory into the test operating state, and, in the test operating state, the control circuit controls the third controllable switch into the on state and turns off the fourth controllable switch, and
wherein, in the test operating state of the integrated semiconductor memory, in the case where the control terminal is driven with a second control signal, the control circuit controls the fifth controllable switch into the on state.

9. The integrated semiconductor memory as claimed in claim 8, wherein, in a normal operating state of the integrated semiconductor memory, in the case of a read and write access to one of the memory cells connected to the word line, the control circuit controls the second controllable switch and the fourth controllable switch into the on state and turns off the first controllable switch, the third controllable switch, and the fifth controllable switch, so that the word line is charged to the second voltage potential by the voltage generator.

10. The integrated semiconductor memory as claimed in claim 4, wherein
the first, third, and fifth controllable switches are each a transistor of a first conductivity type, and
the second and fourth controllable switches are each a transistor of a second conductivity type.

11. The integrated semiconductor memory as claimed in claim 1, further comprising:
a further word line;
a further first controllable switch;
a further second controllable switch, wherein the further word line is connected via the further first controllable switch to the terminal for applying the first voltage potential, the further word line is connected via the further second controllable switch to a further terminal for applying the second voltage potential and the ground potential, the further terminal for applying the second voltage potential and the ground potential is isolated from the second voltage potential and the ground potential;
a further comparator circuit with a first input terminal for applying an input signal, a second input terminal for applying a reference signal, and an output terminal for generating a further evaluation signal, wherein the further word line is connected via the further second controllable switch to the first input terminal of the further comparator circuit; and a logic gate, wherein the evaluation signal generated by the comparator circuit and the further evaluation signal generated by the further comparator circuit is fed to the logic gate on the input side, and the logic gate is connected to the external terminal of the integrated semiconductor memory on the output side.

12. The integrated semiconductor memory as claimed in claim 11, wherein the logic gate is an AND gate.

13. The integrated semiconductor memory as claimed in claim 1, wherein the first voltage potential is a negative voltage potential and the second voltage potential is a positive voltage potential.

14. A method for testing an integrated semiconductor memory, comprising:

applying an address signal to the integrated semiconductor memory for selecting a word line;

applying an activation signal to the integrated semiconductor memory for turning off a first controllable switch and for controlling a second controllable switch into an on state;

applying a precharge signal to the integrated semiconductor memory for controlling the first controllable switch into the on state and for turning off the second controllable switch;

applying a test mode signal for switching the integrated semiconductor memory into a test operating state;

turning off the first controllable switch in the test operating state of the integrated semiconductor memory;

applying an activation signal to the integrated semiconductor memory for evaluating a potential level on the selected word line;

evaluating a potential level on the selected word line by comparing a potential level on the selected word line with a reference level by a comparator circuit;

generating an evaluation signal by the comparator circuit with a first state level, if the potential level on the selected word line lies below the reference level, or generating the evaluation signal by the comparator circuit with a second state level, if the potential level on the selected word line lies above the reference level; and feeding the first and second state levels of the evaluation signal to an external terminal.

15. The method for testing the integrated semiconductor memory as claimed in claim 14, further comprising:

providing the integrated semiconductor memory, in which the word line is connected to the first voltage potential via a third controllable switch; and controlling into the on state the third controllable switch of the selected word line in the test operating state of the integrated semiconductor memory by applying the test mode signal to the integrated semiconductor memory.

16. The method for testing the integrated semiconductor memory as claimed in claim 15, further comprising:

providing the integrated semiconductor memory, in which the word line is connected to an input terminal of the comparator circuit via the second controllable switch;

applying a ground potential to the input terminal of the comparator circuit by applying the test mode signal to the integrated semiconductor memory;

isolating the input terminal of the comparator circuit from the ground potential so that the input terminal of the comparator circuit is at a floating potential state; and evaluating the potential level on the selected word line by the second controllable switch of the selected word line being controlled into the on state by the activation signal applied in the test operating state of the integrated semiconductor memory, and the selected word line thereby being connected to the input terminal of the comparator circuit.

17. The integrated semiconductor memory as claimed in claim 7, further comprising:

a control circuit for controlling the integrated semiconductor memory with a control terminal, wherein, in the case where the control terminal is driven with a first control signal, the control circuit switches the integrated semiconductor memory into the test operating state, and, in the test operating state, the control circuit controls the third controllable switch into the on state and turns off the fourth controllable switch, and wherein, in the test operating state of the integrated semiconductor memory, in the case where the control terminal is driven with a second control signal, the control circuit controls the fifth controllable switch into the on state.

18. The integrated semiconductor memory as claimed in claim 17, wherein, in a normal operating state of the integrated semiconductor memory, in the case of a read and write access to one of the memory cells connected to the word line, the control circuit controls the second controllable switch and the fourth controllable switch into the on state and turns off the first controllable switch, the third controllable switch, and the fifth controllable switch, so that the word line is charged to the second voltage potential by the voltage generator.

19. The integrated semiconductor memory as claimed in claim 7, wherein the first, third, and fifth controllable switches are each a transistor of a first conductivity type, and the second and fourth controllable switches are each a transistor of a second conductivity type.

* * * * *

UNITED STATES PATENT AND TRADEMARK OFFICE
CERTIFICATE OF CORRECTION

PATENT NO. : 7,266,027 B2 Page 1 of 1
APPLICATION NO. : 11/235540
DATED : September 4, 2007
INVENTOR(S) : Ralf Schneider et al.

It is certified that error appears in the above-identified patent and that said Letters Patent is hereby corrected as shown below:

Title Page, Item (54) Title: "SEMICONDUCT" should be --SEMICONDUCTOR--

Col. 1, l. 1(Title): "SEMICONDUCT" should be --SEMICONDUCTOR--

Col. 2, l. 8: "S13" should be --13--

Col. 9, l. 31: "111" should be --11--

Signed and Sealed this

Fifteenth Day of April, 2008

JON W. DUDAS
*Director of the United States Patent and Trademark Office*